United States Patent
Migita

(10) Patent No.: US 8,503,155 B2
(45) Date of Patent: Aug. 6, 2013

(54) WAFER SUPPORT MEMBER, METHOD FOR MANUFACTURING THE SAME AND ELECTROSTATIC CHUCK USING THE SAME

(75) Inventor: Yasushi Migita, Kirishima (JP)

(73) Assignee: Kyocera Corporation, Kyoto (JP)

( * ) Notice: Subject to any disclaimer, the term of this patent is extended or adjusted under 35 U.S.C. 154(b) by 329 days.

(21) Appl. No.: 12/919,717

(22) PCT Filed: Feb. 26, 2009

(86) PCT No.: PCT/JP2009/053505
§ 371 (c)(1),
(2), (4) Date: Nov. 24, 2010

(87) PCT Pub. No.: WO2009/107701
PCT Pub. Date: Sep. 3, 2009

(65) Prior Publication Data
US 2011/0058303 A1 Mar. 10, 2011

(30) Foreign Application Priority Data

Feb. 26, 2008 (JP) ................................. 2008-045092
Mar. 26, 2008 (JP) ................................. 2008-079600

(51) Int. Cl.
*H01L 21/683* (2006.01)
*B32B 7/12* (2006.01)

(52) U.S. Cl.
USPC ......................................... 361/234; 428/354

(58) Field of Classification Search
USPC ......................................... 361/234; 428/354
See application file for complete search history.

(56) References Cited

U.S. PATENT DOCUMENTS

| | | | |
|---|---|---|---|
| 5,844,309 A * | 12/1998 | Takigawa et al. | 257/701 |
| 6,831,307 B2 | 12/2004 | Fujii | 257/180 |
| 7,718,029 B2 * | 5/2010 | Sun et al. | 156/325 |
| 2002/0004134 A1 | 1/2002 | Shima et al. | 428/354 |
| 2003/0047589 A1 | 3/2003 | Fujii | 228/122.1 |
| 2003/0178638 A1 | 9/2003 | Fujii | 257/192 |
| 2005/0056218 A1* | 3/2005 | Sun et al. | 118/715 |
| 2006/0133004 A1* | 6/2006 | Yamamura | 361/234 |

FOREIGN PATENT DOCUMENTS

| | | |
|---|---|---|
| JP | 07-335731 | 12/1995 |
| JP | 2000-109916 | 4/2000 |
| JP | 2001-274229 | 10/2001 |
| JP | 2002-083862 | 3/2002 |
| JP | 2003-080375 | 3/2003 |
| JP | 2003-258065 | 9/2003 |
| JP | 2003-258072 | 9/2003 |
| JP | 2003-273202 | 9/2003 |
| JP | 2006-013302 | 1/2006 |
| JP | 2006-128621 | 5/2006 |

OTHER PUBLICATIONS

Machine translation in English of JP 07-335731A.*
Supplementary European Search Report in related European Application No. EP09715593 mailed Jan. 24, 2011.

* cited by examiner

*Primary Examiner* — Scott Bauer
(74) *Attorney, Agent, or Firm* — DLA Piper LLP (US)

(57) ABSTRACT

To provide a wafer support member that improves soaking properties of heating, the first wafer support member which comprises a base, an insulating material and a bonding layer that bonds the base and the insulating material, wherein the bonding layer has a stacked structure of a plurality of layers including a first layer and a second layer located closer to the insulating material than the first layer, and the first layer and the second layer have different thicknesses.

18 Claims, 10 Drawing Sheets

WAFER SUPPORT MEMBER, METHOD FOR MANUFACTURING THE SAME AND ELECTROSTATIC CHUCK USING THE SAME

CROSS-REFERENCE TO THE RELATED APPLICATIONS

This application is a national stage of international application No. PCT/JP2009/053505, filed on Feb. 26, 2009, and claims the benefit of priority under 35 USC 119 to Japanese Patent Application No. 2008-045092, filed on Feb. 26, 2008 and Japanese Patent Application No. 2008-079600, filed on Mar. 26, 2008, the entire contents of all of which are incorporated herein by reference.

TECHNICAL FIELD

The present invention relates to a wafer support member used, for example, in a film growing apparatus and etching apparatus that employ CVD, PVD or sputtering process.

BACKGROUND ART

Heretofore, wafer support members have been used for supporting semiconductor wafers or glass in film growing apparatus and etching apparatus that employ CVD, PVD or sputtering process. When heating a semiconductor wafer while using the wafer support member, it is required to minimize the unevenness in the amount of heat transferred to the semiconductor wafer. Accordingly, it is required to improve soaking properties of heating a bonding member that bonds an insulating material and a base.

For that purpose, an electrostatic chuck has been proposed having a wafer support member where unevenness in thickness of the bonding member is minimized by providing a spacer to the bonding member, as disclosed in Patent Document 1.

Such an electrostatic chuck has also been proposed that has a wafer support member where a bonding member is divided into a plurality of zones in the bonding interface between the bonding member and an insulating material so that the bonding member has different thermal conductivity in each zone, as disclosed in Patent Document 2.

Patent Document 1: Japanese Unexamined Patent Publication (Kokai) No. 2003-258072
Patent Document 2: Japanese Unexamined Patent Publication (Kokai) No. 2006-13302

DISCLOSURE OF THE INVENTION

Problems to be Solved by the Invention

However, when the spacer disclosed in Patent Document 1 is used, it is necessary to use a plurality of spacers, and therefore there arises a problem of unevenness in thickness among the spacers. When unevenness in thickness among the plurality of spacers is larger than the unevenness in thickness of the bonding member, this not only makes it impossible to decrease the unevenness in thickness of the bonding member but also increases the unevenness in the amount of heat transferred to the semiconductor wafer. In addition, decreasing the unevenness in thickness among the plurality of spacers requires a high accuracy in machining operation, which increases the manufacturing cost.

When the wafer support member disclosed in Patent Document 2 is used, it is required to improve bonding between the insulating material and the bonding member. This is because the bonding member has mutually different thermal conductivity in each zone of the bonding interface between the bonding member and the insulating material, thus resulting not only in uneven distribution of heat but also in difference in the thermal expansion that causes unevenness in bonding with the insulating material among the zones.

The present invention has been made in light of the problem described above, and has an object to provide a wafer support member that improves soaking properties of heating while minimizing the unevenness in bonding between the bonding member and the insulating material, a method of manufacturing the same and an electrostatic chuck using the wafer support member.

Means for Solving the Problems

A first wafer support member of the present invention comprises a base, an insulating material and a bonding layer bonding the base and the insulating material, wherein the bonding layer has a stacked structure of a plurality of layers which includes a first layer and a second layer located closer to the insulating material than the first layer, and a thickness of the first layer and a thickness of the second layer are different from each other.

A second wafer support member of the present invention comprises a base, an insulating material and a bonding layer bonding the base and the insulating material, wherein the bonding layer has a stacked structure of a plurality of layers which includes a first layer and a second layer located closer to the insulating material than the first layer, and thermal conductivity of the first layer and thermal conductivity of the second layer are different from each other.

A first method of manufacturing a wafer support member of the present invention comprises a step of bonding a base and an insulating material via a bonding layer which has a first layer and a second layer, wherein the bonding step comprises a step of disposing the first layer on the base, a step of disposing the second layer having a thickness smaller than that of the first layer on the first layer, and a step of disposing the insulating material on the second layer.

A second method of manufacturing a wafer support member of the present invention comprises a step of bonding a base and an insulating material via a bonding layer which has a first layer and a second layer, wherein the bonding step comprises a step of disposing the second layer on the insulating material, a step of disposing the first layer having a thickness smaller than that of the second layer on the second layer, and a step of disposing the base on the first layer.

An electrostatic chuck of the present invention comprises the first or second wafer support member of the present invention and an electrode which is disposed in the insulating material to electrostatically adsorb a wafer.

Effects of the Invention

The first wafer support member of the present invention constituted as described above has the bonding layer of which thickness can be made uniform and therefore achieves uniform heating of the surface whereon a wafer is placed, because the bonding layer has a stacked structure of a plurality of layers including the first layer and the second layer located closer to the insulating material than the first layer, and a thickness of the first layer and a thickness of the second layer are different from each other.

The second wafer support member of the present invention constituted as described above achieves uniform heating of the surface whereon a wafer is placed, because the bonding layer has a stacked structure of a plurality of layers including the first layer and the second layer located closer to the insulating material than the first layer, wherein thermal conductivity of the first layer and thermal conductivity of the second layer are different from each other.

According to the first and second methods of manufacturing the wafer support member of the present invention, the first wafer support member of the present invention can be manufactured.

The electrostatic chuck of the present invention has the first or second wafer support member of the present invention, and therefore the electrostatic chuck is capable of uniform heating of the surface whereon a wafer is placed can be provided.

Figure 1:
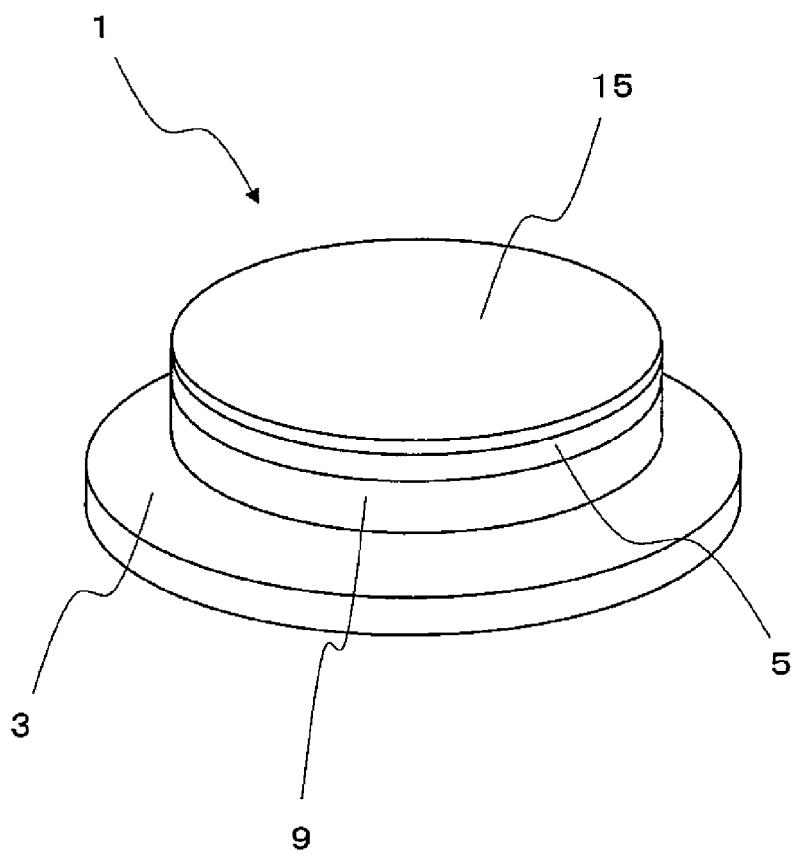
FIG. 1 is a plan view showing a wafer support member according to the first embodiment of the present invention.

DESCRIPTION OF REFERENCE NUMERALS 1, 10: Wafer support member
3: Base
5: Insulating material
9, 90: Bonding layer
11, 91: First layer
13, 92: Second layer
15: Heat equalizer plate
17, 93: Third layer
21: Electrode
25: Heating resistor
51: Bonding material
94: Fourth layer
200: Electrostatic chuck

BEST MODE FOR CARRYING OUT THE INVENTION

The wafer support member of the present invention will be described in detail below with reference to the accompanying drawings.

First Embodiment

Figure 2:
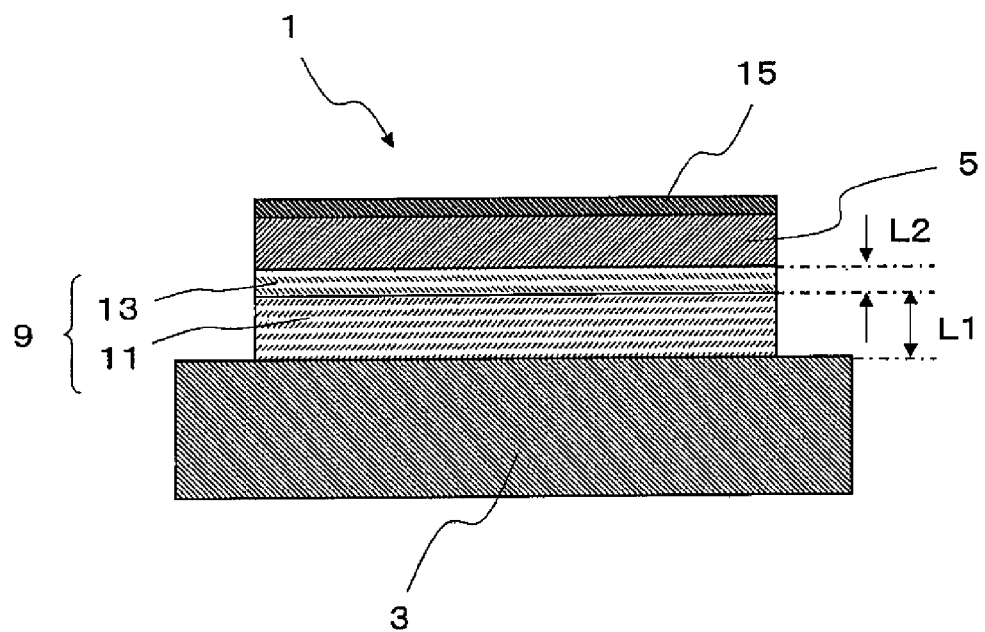
FIG. 2 is a longitudinal sectional view in the embodiment shown in FIG. 1.

As shown in FIG. 1 and FIG. 2, the wafer support member 1 according to the first embodiment of the present invention comprises a base 3, an insulating material 5 and a bonding layer 9 bonding the base 3 and the insulating material 5. The bonding layer 9 has a stacked structure of a plurality of layers including a first layer 11 and a second layer 13 located closer to the insulating material 5 than the first layer 11. The thickness L1 of the first layer 11 and the thickness L2 of the second layer 13 are different from each other. A heat equalizer plate 15 is disposed on a surface of the insulating material 5 opposite to the surface thereof bonded with the second layer 13.

In the wafer support member 1, one principal surface of the insulating material 5 serves as a mounting surface whereon a wafer is placed, while the other principal surface of the insulating material 5 is bonded via the bonding layer 9 to the base 3. This applies also to the wafer support members of the other embodiments.

Since the bonding layer 9 has the first layer 11 and the second layer 13 that are mutually different in thickness, unevenness in thickness of the bonding layer 9 can be made smaller than that of a case where the bonding layer consists of a single layer, while maintaining the thickness of the bonding layer 9.

In the wafer support member 1 of the first embodiment, for example, one of the first layer 11 and the second layer 13 can be formed with a relatively larger thickness in order to ensure the thickness of the bonding layer 9 while forming the other layer as a thickness adjusting layer, thus enabling it to reduce the unevenness in thickness of the bonding layer 9 as a whole.

In the first embodiment, as shown in FIG. 2, it is preferable that the thickness L1 of the first layer 11 is larger than the thickness L2 of the second layer 13. This is because roughness of the surface of the bonding layer 9 that faces the insulating layer 5 can be decreased when the thickness L2 of the second layer 13 located closer to the insulating material 5 than the first layer 11 is smaller than the thickness L1 of the first layer 11. As a result, bonding between the bonding layer 9 and the insulating material 5 can be improved. The constitution described above is effective when it is desired to improve bonding between the bonding layer 9 and the insulating material 5.

Metals such as aluminum or cemented carbide, or a composite material consisting of such a metal and ceramics base 3 constituting the wafer support member 1 of the present embodiment can be used. Sintered ceramics can be used, for example, as the material of the insulating layer 5. Specifically, $Al_2O_3$, SiC, AlN or $Si_3N_4$ can be used. In view of corrosion resistance, $Al_2O_3$ or AlN can be particularly preferably used as the material of the base 3.

Any material that is capable of bonding the insulating layer 5 and the base 3 can be used as the material of the bonding layer 9. For example, a silicone resin, an epoxy resin or an acrylic resin can be used. It is preferred that a plurality of layers that constitute the bonding layer 9 contain substantially the same resin components. This improves bonding between the layers that constitute the bonding layer 9, so that it is possible to stably maintain the shape of the bonding layer 9. It is particularly preferred that the plurality of layers that constitute the bonding layer 9 may contain substantially the same resin as the main component.

It is preferable that the bonding layer 9 contains a filler. Including the filler enables it to improve soaking properties of the bonding layer 9, and therefore soaking properties of the insulating material 5 and the base 3 can be improved.

It is preferable that the filler has the same or higher thermal conductivity as that of the insulating material 5 and the base 3, and metal particles or ceramics particles can be used. Specifically, in the case of a metal, aluminum or an aluminum alloy can be used. In the case of ceramics, $Al_2O_3$, SiC, AlN or $Si_3N_4$ can be used.

It is also preferable that a part of the filler exists in the interface between each layer of the bonding layer 9. This is because the filler that serves as an anchor further improves bonding between each layer.

The thickness of the bonding layer 9 is preferably in a range from 0.2 to 1.5 mm. When the thickness of the bonding layer 9 is 0.2 mm or more, it is made possible to mitigate the thermal stress and physical stress generated between the insulating layer 5 and the base 3, thereby decreasing a possibility of cracks to occur in the insulating layer 5 or the base 3. When the thickness of the bonding layer 9 is 1.5 mm or less, the thickness of the bonding layer 9 can be suppressed from unevenness.

When the bonding layer 9 contains a filler, the thickness of a layer having the least thickness among each layer constituting the bonding layer 9 (the second layer 13 in the present embodiment) is preferably more than the particle size of the filler. This constitution enables it to suppress the thickness of the bonding layer 9 from unevenness due to the presence of the filler. Quantitatively, it is preferable that the thickness of a layer having the least thickness among each layer of the bonding layer 9 is 0.03 mm or more.

It is also preferable that the layer having a relatively larger thickness such as the first layer 11 of the first embodiment has a higher modulus of elasticity than that of the second layer 13 of the present embodiment that has a relatively smaller thickness. This is because firm bonding with the insulating layer 5 (or the base 3) can be achieved in the layer having a relatively smaller thickness while better stress mitigating effect can be achieved against thermal stress in the layer having a relatively larger thickness.

Manufacturing Method

A method of manufacturing the wafer support member 1 of the first embodiment will be described in detail below with reference to the accompanying drawings.

Figure 6A:
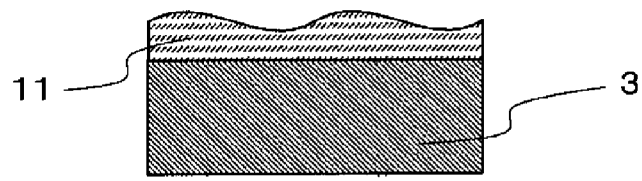
FIG. 6A is a sectional view showing a step of forming a first layer on a base in the method of manufacturing a wafer support member according to the first embodiment.
Figure 6B:
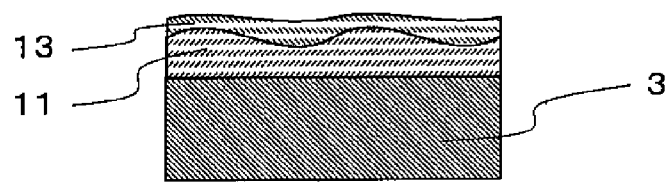
FIG. 6B is a sectional view showing a step of forming a second layer on a first layer in the method of manufacturing a wafer support member according to the first embodiment.
Figure 6C:
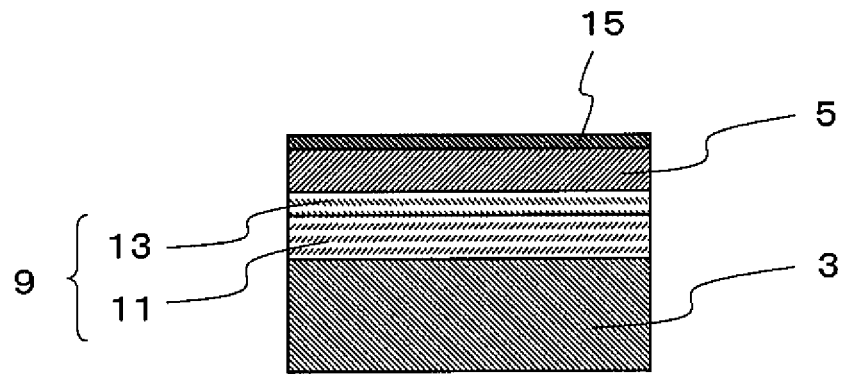
FIG. 6C is a sectional view showing a step of forming an insulating material on a second layer in the method of manufacturing a wafer support member according to the first embodiment.

As shown in FIGS. 6A to 6C, the method of manufacturing the wafer support member 1 of the first embodiment comprises a step of bonding the base 3 and the insulating material 5 via the bonding layer 9 having the first layer 11 and the second layer 13. The step of bonding the base 3 and the insulating material 5 comprises a step of disposing the first layer 11 on the base 3, a step of disposing the second layer 13 having a thickness smaller than the first layer 11 on the first layer 11 (FIG. 6A), and a step of disposing the insulating material 5 on the second layer 13 (FIG. 6B).

As the step of disposing the second layer 13 having a relatively smaller thickness on the first layer 11 that has a relatively larger thickness is provided as described above, the second layer 13 acts to suppress the thickness of the first layer 11 from unevenness. In other words, the second layer 13 is formed to function as a thickness adjusting layer that accommodates unevenness in thickness of the first layer 11, in order to suppress the thickness of the bonding layer 9 as a whole from unevenness. Accordingly, unevenness in thickness of the entire bonding layer 9 can be made smaller while maintaining the thickness of the bonding layer 9, compared to the case where the bonding layer 9 is constituted from a single layer. As a result, soaking properties on the surface of the insulating layer 5 can be improved.

It is preferable to provide a step of processing the surface of the first layer 11 that bonds with the second surface 13 to make it flat, after the step of disposing the first layer 11 on the base 3 and before the step of disposing the second layer 13 on the first layer 11.

Since unevenness in thickness of the first layer 11 can be decreased by this constitution, unevenness in thickness of the bonding layer 9 can be further decreased. For the method to process the surface of the first layer 11 that bonds with the second surface 13 to make it flat, for example, pressing of the surface of the first layer 11 that bonds with the second surface 13, or rubbing off the surface of the first layer 11 that bonds with the second surface 13 may be employed. As used herein, the expression of processing a surface to make it flat means to reduce surface roughness of the first layer 11 so that it becomes smaller than that of prior to the processing, not to make it strictly flat.

It is also preferable to provide a step of processing the surface of the second layer 13 that bonds with the insulating layer 5 to make it flat, after the step of disposing the second layer 13 on the first layer 11 and before the step of disposing the insulating layer 5 on the second layer 13.

Unevenness in thickness of the bonding layer 9 can be decreased further by this constitution. For the method to process the surface of the second layer 13 that bonds with the insulating layer 5 to make it flat, those employed for the first layer 11 may be used. As used herein, the expression of processing the surface to make it flat does not mean to make it strictly flat, as described above in relation to the first layer 11.

In case the bonding layer 9 is formed from a thermosetting resin, it is preferable to provide a step of heating the first layer 11 to a temperature or higher the curing temperature of the bonding member constituting the first layer 11 (hereafter referred to as the first bonding member) after the step of disposing the first layer 11 on the base 3 and before the step of disposing the second layer 13 on the first layer 11. This constitution decreases the unevenness in thickness of the first layer 11.

It is more preferable that the curing temperature of the bonding member constituting the second layer 13 (hereafter referred to as the second bonding member) is lower than the curing temperature of the first bonding member, and that a step of heating the bonding layer 9 to a temperature or higher than curing temperature of the second bonding member and is a curing temperature or higher of the first bonding member is provided after the step of disposing the second layer 13 on the first layer 11. This constitution enables it to harden only the second bonding member, thereby decreasing the unevenness in thickness of the bonding layer 9.

Second Embodiment

The wafer support member 1 of the second embodiment will be described below.

Figure 3:
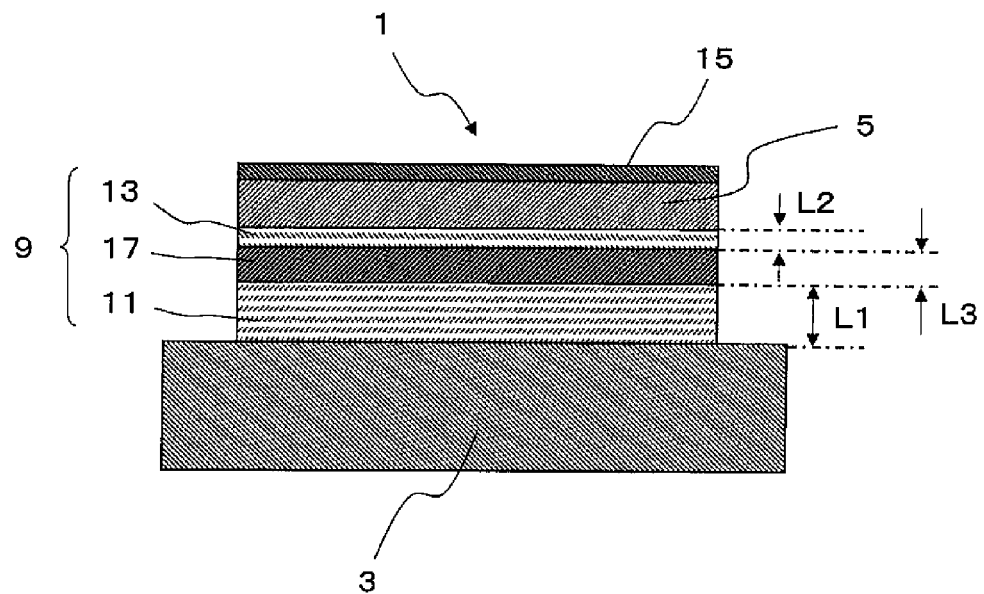
FIG. 3 is a sectional view showing a wafer support member according to the second embodiment of the present invention.

The wafer support member 1 of the second embodiment has such a constitution as the bonding layer 9 has a third layer 17 disposed between the first layer 11 and the second layer 13, as shown in FIG. 3. The thickness L3 of the third layer 17 is smaller than the thickness L1 of the first layer 11, and is larger than the thickness L2 of the second layer 13. Providing the third layer 17 as described above makes it possible to decrease the thickness of each layer constituting the bonding layer 9 stepwise from the base 3 side toward the insulating layer 5 side of the bonding layer 9, so that the roughness of the surface of the bonding layer 9 that faces the insulating layer 5 can be decreased. As a result, bonding between the bonding layer 9 and the insulating layer 5 can be further improved.

Also according to the second embodiment, unevenness in thickness of the first layer 11 can be corrected by applying fine adjustment by means of the second layer 13 after rough adjustment by means of the third layer 17, so as to decrease the unevenness in thickness of the entire bonding layer 9.

Third Embodiment

The wafer support member 1 of the third embodiment will be described below.

Figure 4:
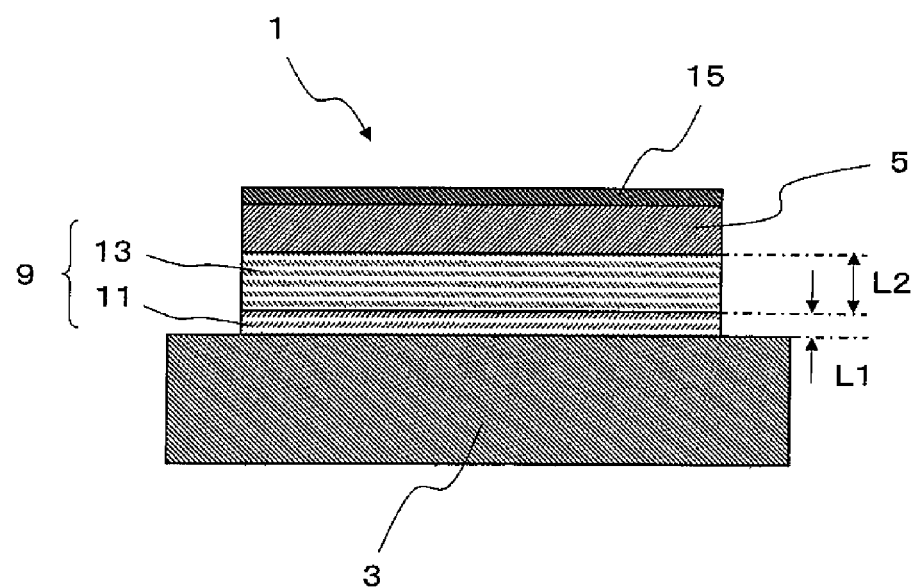
FIG. 4 is a sectional view showing a wafer support member according to the third embodiment of the present invention.

In the wafer support member 1 of the third embodiment, as shown in FIG. 4, the thickness. L1 of the first layer 11 is smaller than the thickness L2 of the second layer 13. This is because roughness of the surface of the bonding layer 9 that faces the base 3 can be decreased when the thickness L2 of the second layer 13 located closer to the insulating material 5 than the first layer 11 is larger than the thickness L1 of the first layer 11. As a result, bonding between the bonding layer 9 and the base 3 can be further improved. The constitution described above is effective when it is desired to improve bonding between the insulating layer 5 and the base 3.

In order to cause the first layer 11 to function as a thickness adjusting layer when the thickness L1 of the first layer 11 is smaller than the thickness L2 of the second layer 13 as in the third embodiment, the following manufacturing method may be employed.

Manufacturing Method

The method of manufacturing the wafer support member 1 of the third embodiment will be described.

Figure 7A:
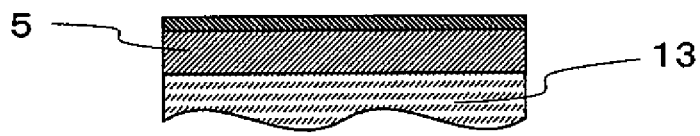
FIG. 7A is a sectional view showing a step of forming a second layer on an insulating material in the method of manufacturing a wafer support member according to the second embodiment.
Figure 7B:
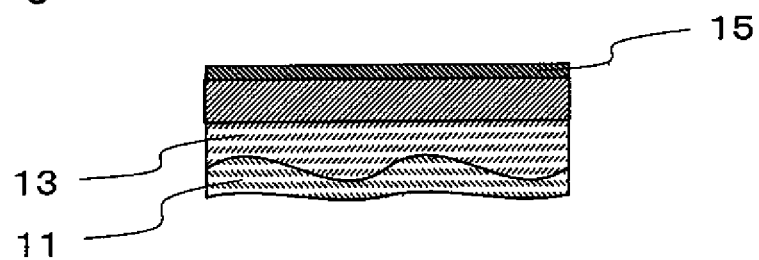
FIG. 7B is a sectional view showing a step of forming a first layer on a second layer in the method of manufacturing a wafer support member according to the second embodiment.
Figure 7C:
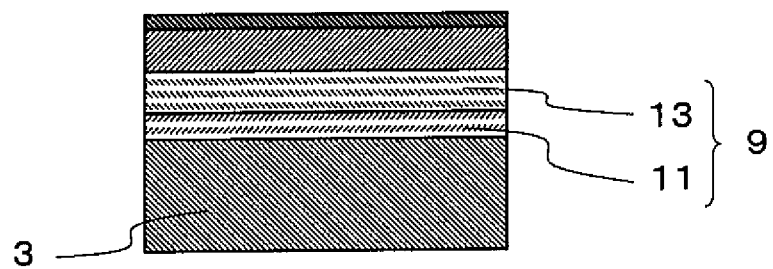
FIG. 7C is a sectional view showing a step of forming a base on a first layer in the method of manufacturing a wafer support member according to the second embodiment.

As shown in FIGS. 7A to 7C, the method of manufacturing a wafer support member 1 of the third embodiment comprises a step of bonding the base 3 and the insulating material 5 via the bonding layer 9 having the first layer 11 and the second layer 13. The step of bonding the base 3 and the insulating material 5 comprises a step of disposing the second layer 13 on the insulating layer 5 (FIG. 7A), a step of disposing the first layer 11 having a smaller thickness than that of the second layer 13 on the second layer 13 (FIG. 7B), and a step of disposing the base 3 on the first layer 11.

As the step of disposing the first layer 11 having a relatively smaller thickness on the second layer 13 that has a relatively larger thickness is provided as described above, the first layer 11 acts to suppress the thickness of the second layer 13 from unevenness. Accordingly unevenness in thickness of the bonding layer 9 can be made smaller than that of the case where the bonding layer 9 is constituted from a single layer, while maintaining the thickness of the bonding layer 9.

It is preferable to provide a step of processing the surface of the second layer 13 that bonds with the first surface 11 to make it flat, after the step of disposing the second layer 13 on the insulating layer 5 and before the step of disposing the first layer 11 on the second layer 13.

Unevenness in thickness of the bonding layer 9 can be further decreased by this constitution. For the method of processing the surface of the second layer 13 that bonds with the first surface 11 to make it flat, for example, pressing of the surface of the second layer 13 that bonds with the first surface 11, or rubbing off the surface of the second layer 13 that bonds with the first surface 11 may be employed. The expression of processing a surface to make it flat means to reduce surface roughness of the second layer 13 so that it becomes smaller than that of prior to the processing, not to make it strictly flat.

Similarly, it is also preferable to provide a step of processing the surface of the first layer 11 that bonds with the base 3 to make it flat, after the step of disposing the first layer 11 on the second layer 13 and before the step of disposing the base 3 on the first layer 11.

Unevenness in thickness of the bonding layer 9 can be decreased by this constitution. For the method of processing the surface of the first layer 11 that bonds with the base 3 to make it flat, those employed for the second layer 13 may be used. The expression of processing the surface to make it flat does not mean to make it strictly flat, as described above in relation to the second layer 13.

It is preferable that a step of heating the second layer 13 to a temperature of the curing temperature or higher of the bonding member constituting the second layer 13 (hereafter referred to as the second bonding member) is provided after the step of disposing the second layer 13 on the insulating material 5. This constitution decreases the unevenness in thickness of the second layer 13.

It is more preferable that the curing temperature of the bonding member constituting the first layer 11 (hereafter referred to as the first bonding member) is lower than the curing temperature of the second bonding member, and that a step of heating the bonding layer 9 to a temperature of the curing temperature or higher of the first bonding member and is the curing temperature or lower of the second bonding member is provided after the step of disposing the first layer 11 on the second layer 13. This constitution enables it to harden only the first bonding member, thereby decreasing the unevenness in thickness of the bonding layer 9.

Fourth Embodiment

The wafer support member 1 of the fourth embodiment will be described below.

Figure 5:
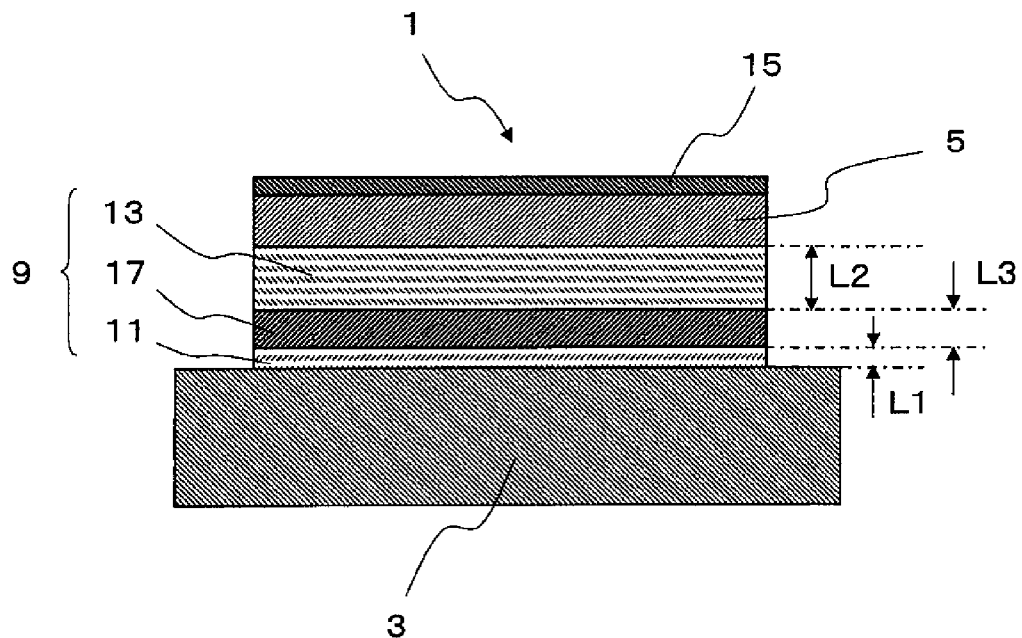
FIG. 5 is a sectional view showing a wafer support member according to the fourth embodiment of the present invention.

The wafer support member 1 of the fourth embodiment has such a constitution as the bonding layer 9 has the third layer 17 disposed between the first layer 11 and the second layer 13, as shown in FIG. 5. It is preferable that the thickness L3 of the third layer 17 is larger than the thickness L1 of the first layer 11, and is smaller than the thickness L2 of the second layer 13. Providing the third layer 17 as described above makes it possible to decrease the thickness of each layer constituting the bonding layer 9 stepwise from the insulating layer 5 side of the bonding layer 9 toward the base 3 side. As a result, bonding between the bonding layer 9 and the base 3 can be further improved, while further mitigating the thermal stress generated in the interface between the bonding layer 9 and the insulating layer 5.

Fifth Embodiment

Figure 8:
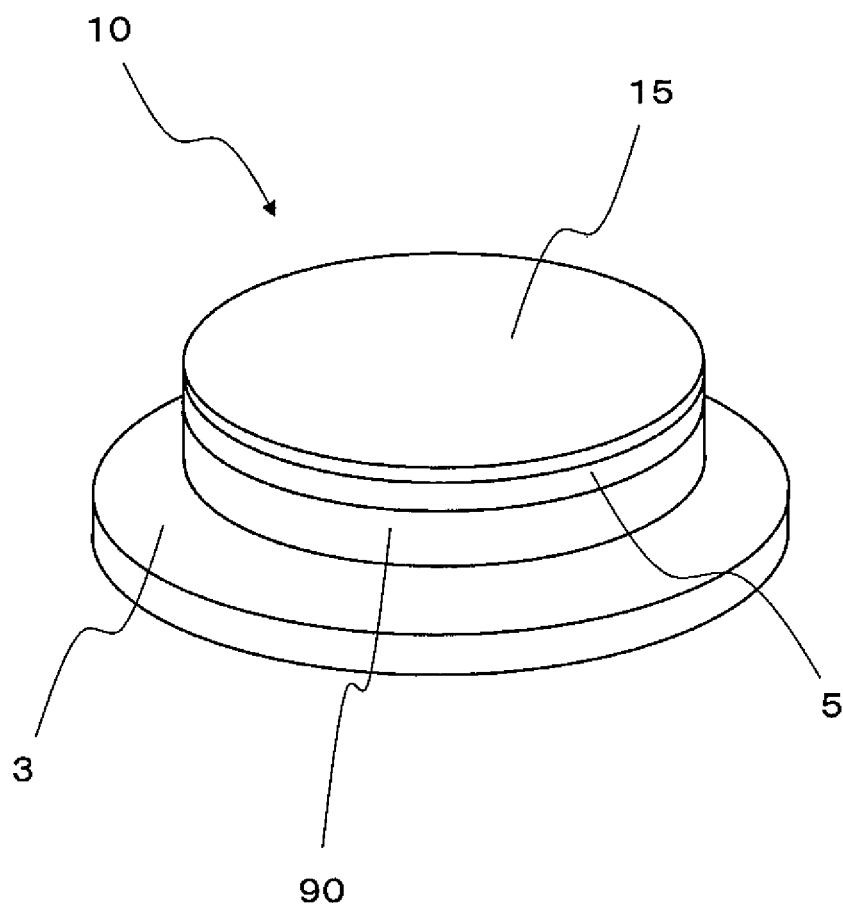
FIG. 8 is a plan view showing a wafer support member according to the fifth embodiment of the present invention.
Figure 9:
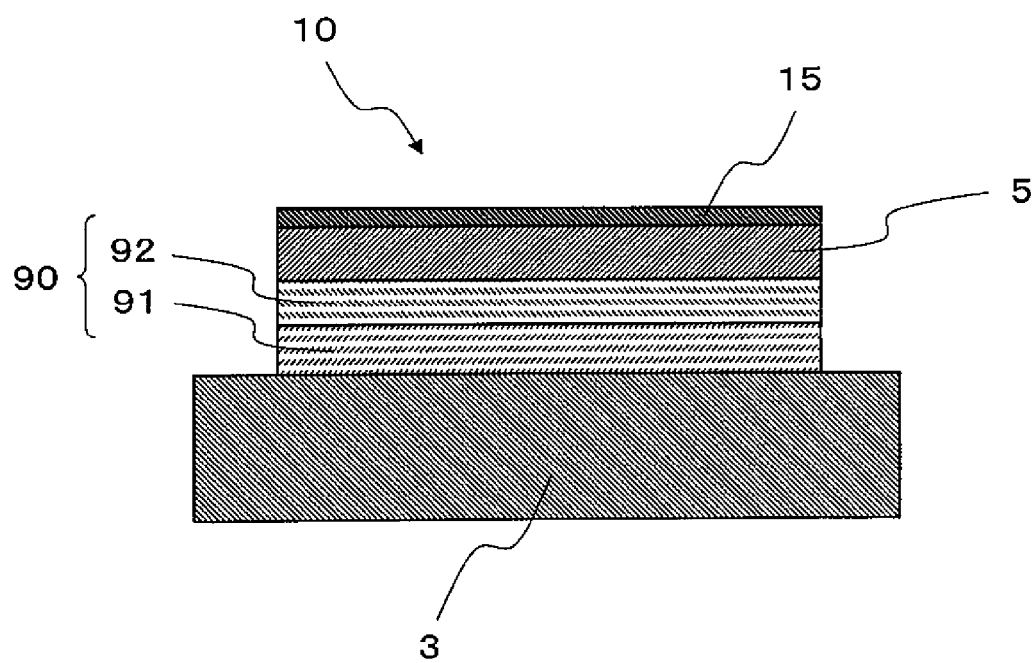
FIG. 9 is a longitudinal sectional view in the fifth embodiment shown in FIG. 8.

As shown in FIG. 8 and FIG. 9, wafer support member 10 according to the fifth embodiment of the present invention comprises the base 3, the insulating material 5 of which one principal surface is used as a mounting surface whereon a wafer is placed, and a bonding layer 90 that bonds the base 3 and the other principal surface of the insulating material 5. The bonding layer 90 has a stacked structure of a plurality of layers which includes a first layer 91 and a second layer 92 located closer to the insulating material 5 than the first layer 91. Thermal conductivity of the first layer 91 and thermal conductivity of the second layer 92 are different from each other. The heat equalizer plate 15 is disposed on a surface (hereafter referred to as principal surface) of the insulating material 5 opposite to the surface bonded with the second layer 92. In the fifth embodiment, components similar to those of the first embodiment will be denoted with similar reference numerals.

Since the bonding layer 90 has the first layer 91 and the second layer 92 that have different thermal conductivity, unevenness in bonding between the bonding layer 90 and the insulating material 5 can be decreased while maintaining soaking properties of the bonding layer 90.

It is preferable that thermal conductivity of the second layer 92 is higher than thermal conductivity of the first layer 91. This is because soaking properties of the amount of heat transferred to the principal surface of the insulating layer 5 can be further improved when thermal conductivity of the second layer 92 that is located closer to the insulating material 5 is relatively higher.

Any material that is capable of bonding the insulating layer 5 and the base 3 can be used as the material of the bonding layer 90. Specifically, a silicone resin, an epoxy resin or an acrylic resin can be used. The plurality of layers that constitute the bonding layer 90 may contain substantially the same resin components. This improves bonding between each layer that constitutes the bonding layer 90, so as to stably maintain the shape of the bonding layer 90.

As used herein, the phrase that substantially nearly the same resin components are contained means that same kinds of resin are contained. Specifically, it means that each layer contains any one of a silicone resin, an epoxy resin or an acrylic resin described above.

The first layer 91 and the second layer 92 having different thermal conductivity can be formed, for example, by using materials containing different components.

For example, the first layer 91 may be formed from a silicone resin and the second layer 92 may be formed from an epoxy resin. In this case, roughness of the bonding surface between the bonding layer 90 and the insulating layer 5 can be decreased and soaking properties can be improved by making thermal conductivity of the epoxy resin substantially the same as thermal conductivity of the insulating layer 5.

As another example, the first layer 91 may be formed from a silicone resin and the second layer 92 may be formed from a silicone resin having different thermal conductivity. In this case, roughness of the bonding surface between the insulating layer 5 and the bonding layer 90 can be mitigated to improve soaking properties and bonding between the first layer 91 and the second layer 92 can be improved by making thermal conductivity of the silicone resin of the second layer 92 substantially the same as thermal conductivity of the insulating layer 5. Thermal conductivity can be easily obtained by adjusting the content of the filler.

The first layer 91 and the second layer 92 having different thermal conductivity can be formed also by making the content or surface area of the filler 51 added to both layers different from each other, as will be described later.

Thermal conductivity of each layer can be measured by using a known heat ray method or laser flash method.

It is preferable that the bonding layer 90 contains the filler 51. Including the filler 51 enables it to improve soaking properties of the bonding layer 90, and therefore soaking properties of the insulating material 5 and the base 3 can be improved.

It is preferable that the filler 51 has the same or higher thermal conductivity as that of the insulating material 5 and the base 3 and, for example, metal particles or ceramics particles can be used. Specifically, in the case of a metal, aluminum or an aluminum alloy can be used. In the case of ceramics, $Al_2O_3$, SiC, AlN or $Si_3N_4$ can be used.

It is also preferable that a part of the filler 51 exists in the interface between each layer of the bonding layer 90. This is because the filler 51 serves as an anchor and further improves bonding between the layers.

When the bonding layer 90 contains the filler 51, it is preferable that the thickness of each layer constituting the bonding layer 90 is larger than the particle size of the filler 51. This constitution enables it to suppress the thickness of the bonding layer 90 from unevenness due to the presence of the filler 51. Quantitatively, it is preferable that the thickness of each constituting layer of the bonding layer 90 is 0.03 mm or more.

When the bonding layer 90 contains the filler 51, it is preferable that content of the filler 51 in the second layer 92 is higher than that of the first layer 91. Since higher content of the filler 51 results in higher thermal conductivity, this constitution makes the thermal conductivity of the second layer 92 higher than that of the first layer 91.

The content of the filler 51 in the bonding layer 90 may be determined as follows. In a cross section that is perpendicular to the principal surface of the insulating layer 5 and includes the first layer 91 and the second layer 92, cross sectional areas of the filler 51 are respectively measured and summed up in the first layer 91 and the second layer 92. The sum of cross sectional areas of the filler 51 in each layer is divided by the entire cross sectional area of each layer, which is taken as the content of the filler. Content of the filler 51 can be compared between the first layer 91 and the second layer 92 by using the value of content determined as described above. While evaluation may be made for the entire cross section as described above, a part of the cross section may also be evaluated for the sake of convenience.

When the bonding layer 90 contains the filler 51, it is preferable that proportion of surface area of the filler 51 contained in the second layer 92 is higher than that of the first layer 91. Since a larger surface area of the filler 51 results in higher thermal conductivity, this constitution makes thermal conductivity of the second layer 92 higher than that of the first layer 91.

Significance of the proportion of surface area of the filler 51 will be described below.

Proportion of surface area of the filler 51 contained in the bonding layer 90 may be determined as follows. In a cross section that is perpendicular to the principal surface of the insulating layer 5 and includes the first layer 91 and the second layer 92, border lines between the bonding layer 90 and the filler 51 in the first layer 91 and the second layer 92 are respectively measured and summed up. The sum of the border lines in each layer is divided by the entire cross sectional area of each layer, which is taken as the proportion of surface area of the filler 51. The proportion of surface area of the filler 51 can be compared between the first layer 91 and the second layer 92 by using the proportion of the surface area determined as described above. While evaluation may be made for the entire cross section as described above, a part of the cross section may also be evaluated for the sake of convenience.

It is preferable that mean particle size of the filler 51 contained in the second layer 92 is smaller than mean particle size of the filler 51 contained in the first layer 91. This enables it to improve durability of the bonding layer 90 while suppressing the content of the filler 51 contained in the second layer 92 and improving soaking properties of the bonding layer 90. Higher content of the filler 51 leads to higher soaking properties, but results in lower durability. However, the constitution described above enables it to increase the surface area of the filler 51 while suppressing the content of the filler 51, so that durability of the second layer 92 can be improved while improving soaking properties the second layer 92.

Figure 10A:
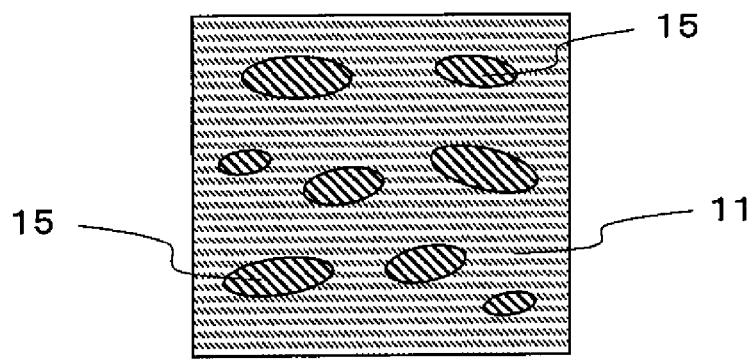
FIG. 10A is an enlarged sectional view of a second layer according to the variation in the fifth embodiment of the present invention.
Figure 10B:
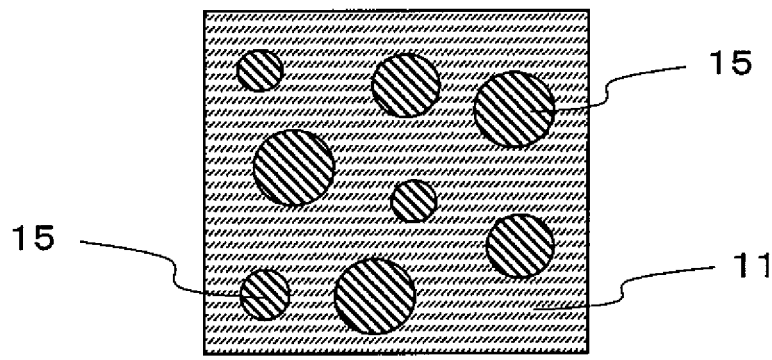
FIG. 10B is an enlarged sectional view of a first layer according to the variation in the fifth embodiment of the present invention.

It is preferable that the filler 51 contained in the second layer 92 has a flattened shape that is parallel to the interface between the bonding layer 90 and the insulating material 5, in comparison to the filler 51 contained in the first layer 91 as shown in FIG. 10. This enables it to improve soaking properties of the bonding surface between the bonding layer 90 and the insulating material 5 while suppressing the content of the filler 51 contained in the second layer 92. This also enables it to improve the durability of the bonding layer 90.

The thickness of the bonding layer 90 is preferably in a range from 0.2 to 1.5 mm. When the thickness of the bonding layer 90 is 0.2 mm or more, it is made possible to mitigate the thermal stress and physical stress generated between the insulating layer 5 and the base 3 and decreases a possibility of cracks to occur in the insulating layer 5 or the base 3. When the thickness of the bonding layer 90 is 1.5 mm or less, the thickness of the bonding layer 90 can be suppressed from unevenness.

Manufacturing Method

The method of manufacturing the wafer support member of the fifth embodiment will be described in detail below with reference to the accompanying drawings.

Figure 13A:
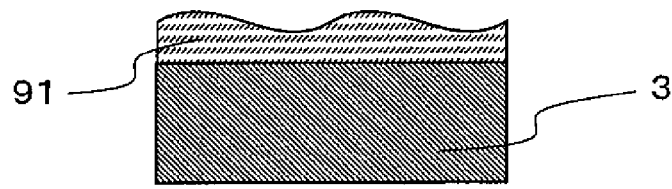
FIG. 13A is a sectional view showing a step of forming a first layer on a base in the method of manufacturing a wafer support member according to the fifth embodiment.
Figure 13B:
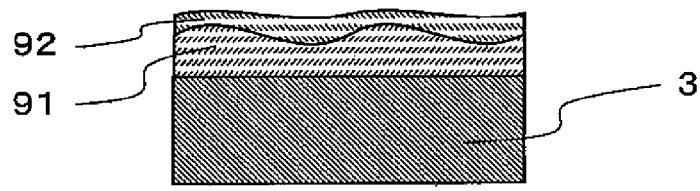
FIG. 13B is a sectional view showing a step of forming a second layer on a first layer in the method of manufacturing a wafer support member according to the fifth embodiment.
Figure 13C:
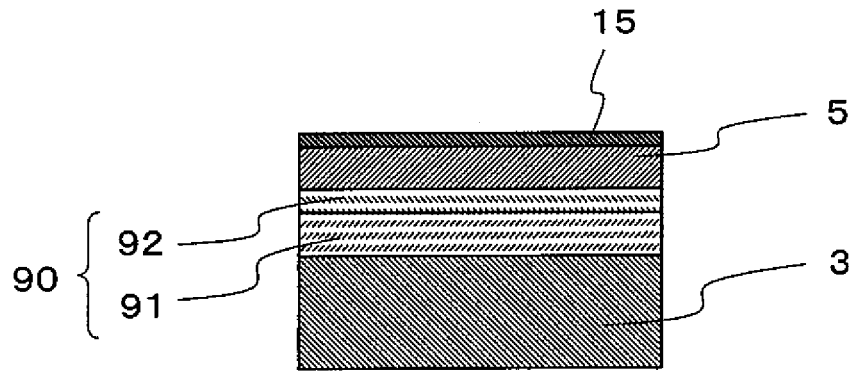
FIG. 13C is a sectional view showing a step of forming an insulating material on a second layer in the method of manufacturing a wafer support member according to the fifth embodiment.

As shown in FIGS. 13A to 13C, the method of manufacturing the wafer support member 10 of the fifth embodiment comprises a step of bonding the base 3 and the insulating material 5 via the bonding layer 90 having the first layer 91 and the second layer 92. The step of bonding the base 3 and the insulating material 5 comprises a step of disposing the first layer 91 on the base 3 as shown in FIG. 13A, a step of disposing the second layer 92 on the first layer 91 as shown in FIG. 13B, and a step of disposing the insulating material 5 on the second layer 92 as shown in FIG. 13C.

According to the method of manufacturing the wafer support member 10 of the fifth embodiment, materials having different thermal conductivity are used as the materials of the first layer 91 and the second layer 92.

Also according to the method of manufacturing the wafer support member 10 of the fifth embodiment, the second layer 92 may be formed to function as a thickness adjusting layer that accommodates the unevenness in thickness of the first layer 91, in order to suppress the thickness of the entire bonding layer 90 from unevenness, similarly to the manufacturing method of the first embodiment. As a result, soaking properties on the surface of the insulating layer 5 can be further improved. Preferable form of forming the second layer 92 as the thickness adjusting layer is similar to that described in relation to the production method of the first embodiment.

The wafer support member 10 is not limited to that manufactured by the manufacturing methods described above, and may be formed by any production method as long as the base 3 and the insulating material 5 can be bonded together via the bonding layer 90.

Figure 14A:
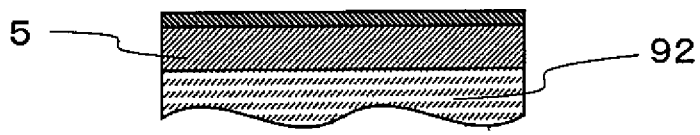
FIG. 14A is a sectional view showing a step of forming a second layer on an insulating material in the variation of the method of manufacturing a wafer support member according to the fifth embodiment.
Figure 14B:
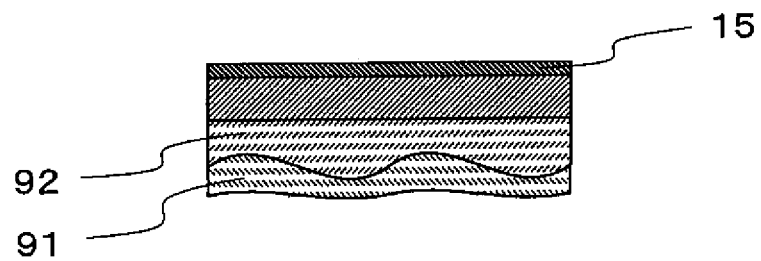
FIG. 14B is a sectional view showing a step of forming a first layer on a second layer in the variation of the method of manufacturing a wafer support member according to the fifth embodiment.
Figure 14C:
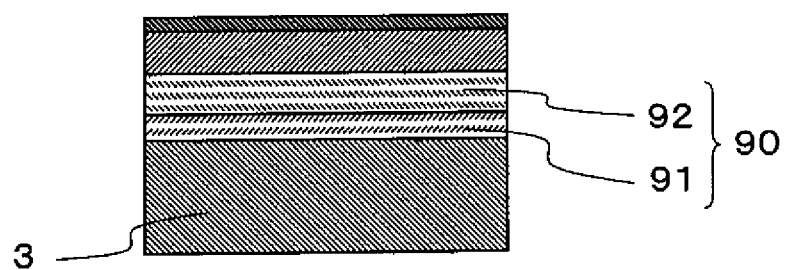
FIG. 14C is a sectional view showing a step of forming a base on a first layer in the variation of the method of manufacturing a wafer support member according to the fifth embodiment.

For example, the second layer 92 may be disposed on the first layer 91 after disposing the first layer 91 on the base 3 similarly to the embodiment described above, the first layer 91 and the second layer 92 may be disposed on the base 3 after disposing the second layer 92 on the first layer 91. Alternatively, such a procedure may be employed that, after disposing the second layer 92 on the insulating material 5 as shown in FIG. 14A, the first layer 91 is disposed on the second layer 92 as shown in FIG. 14B, and then the base 3 is disposed on the first layer 91 as shown in FIG. 14C.

Sixth Embodiment

The wafer support member of the sixth embodiment will be described below.

The wafer support member 10 of the sixth embodiment has such a constitution as the first layer 91 contains the first filler 51 and the second layer 92 contains the second filler 51. The second filler 51 has higher thermal conductivity than that of the first filler 51. Thus thermal conductivity of the second layer 92 can be made higher than thermal conductivity of the first layer 91.

Seventh Embodiment

The wafer support member of the seventh embodiment will be described below.

Figure 11:
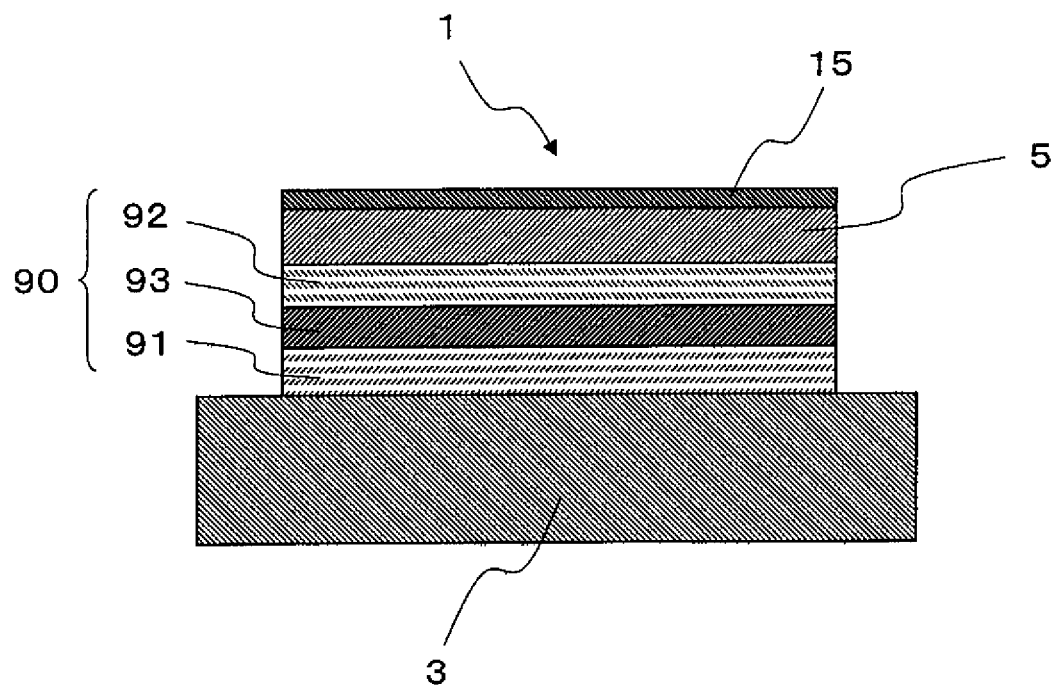
FIG. 11 is a plan view showing a wafer support member according to the seventh embodiment of the present invention.
Figure 12:
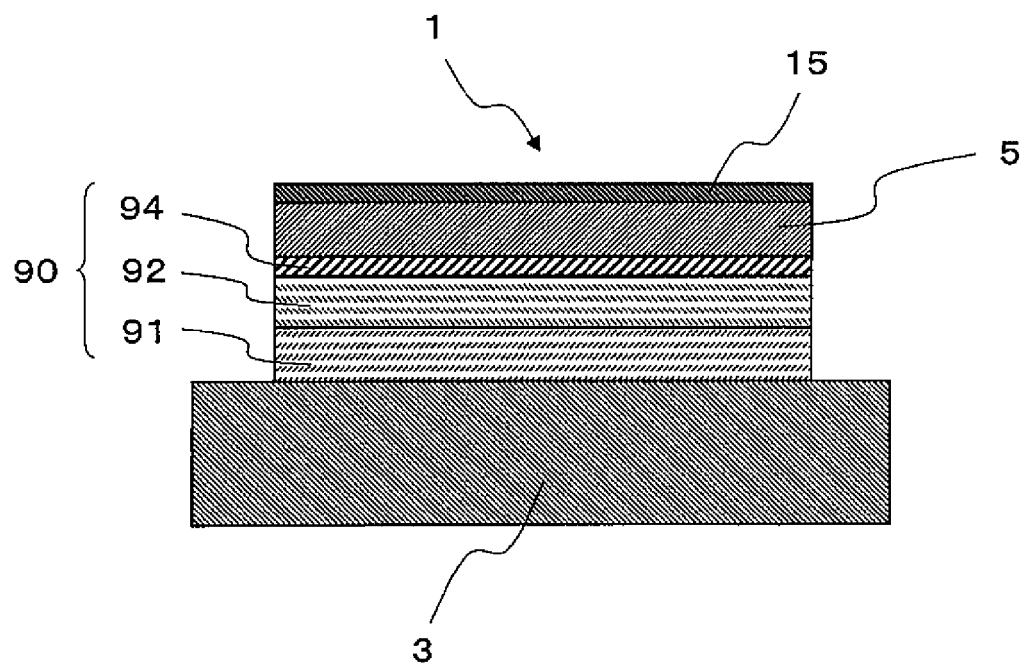
FIG. 12 is a plan view showing a wafer support member according to the eighth embodiment of the present invention.

The wafer support member 10 of the seventh embodiment has such a constitution as the bonding layer 90 has a third layer 93 disposed between the first layer 91 and the second layer 92, as shown in FIG. 11. The third layer 93 is higher in thermal conductivity than the first layer 91, and the second layer 92 is higher in thermal conductivity than the third layer 93. Increasing the thermal conductivity of the bonding layer stepwise toward the insulating material 5 makes it possible to further improve the soaking properties of the bonding layer 90 while suppressing the heat loss due to heat dissipation.

Eighth Embodiment

The wafer support member of the eighth embodiment will be described below.

The wafer support member 10 of the eighth embodiment has such a constitution as the bonding layer 90 has a fourth layer 94 that is located closer to the insulating material 5 than the second layer 92 and bonds with the insulating material 5, and the fourth layer 94 has less content of the filler 51 than that of other layers that constitute the bonding layer 90. This constitution improves the bonding strength between the insulating layer 5 and the bonding layer 90. This is because less content of the filler 51 increase the bonding strength between the insulating layer 5 and the bonding layer 90.

It is particularly preferable that the fourth layer 94 does not contain the filler 51. This further improves the bonding strength between the insulating layer 5 and the bonding layer 90.

It is preferable that the fourth layer 94 is thinner than the second layer 92 in thickness. This improves the bonding strength between the insulating material 5 and the bonding layer 90 by means of the fourth layer 94, while improving soaking properties by the second layer 92.

The electrostatic chuck according to the embodiment of the present invention will be described below.

Figure 15:
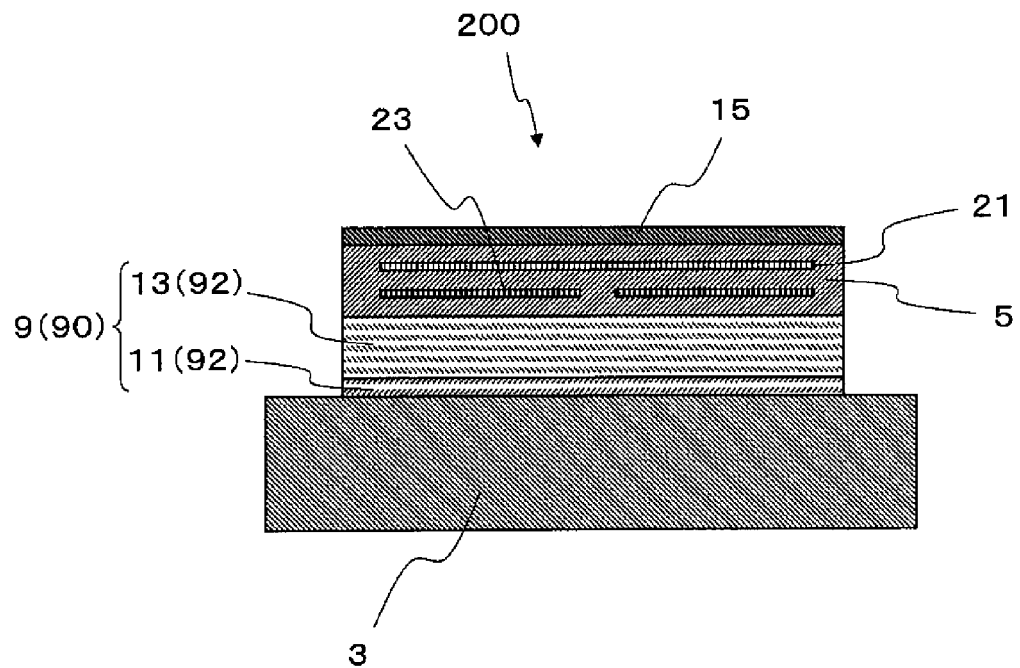
FIG. 15 is a sectional view showing an electrostatic chuck according to the first embodiment of the present invention.

As shown in FIG. 15, the electrostatic chuck 200 of the present embodiment comprises the wafer support member 1 (10) of the first to ninth embodiment, the electrode 21 disposed in the insulating material 5 to attract a wafer by electrostatic force, and a heating resistor 23 disposed in the insulating material 5 wherein the electrode 21 is embedded. The heating resistor 23 is embedded in the insulating material 5 at a position closer to the base 3 than the electrode 21. A semiconductor wafer can be attracted onto the electrostatic chuck 200 by placing the semiconductor wafer on the mounting surface of the insulating material 5 and energizing the electrode 21.

The electrostatic chuck 200 of the present embodiment has the heating resistor 23 disposed in the insulating material 5 wherein the electrode 21 is embedded. In the electrostatic chuck 200 of the present embodiment, the bonding layer 9 (90) has the first layer 11 (91) and the second layer 13 (92) that have different thicknesses which improve soaking properties of the surface of the insulating layer 5, and therefore unevenness in the amount of heat transferred to the semiconductor wafer is decreased when the heating resistor 23 is energized. A material containing a carbide, nitride or silicate of W, Mo or Ti as main components can be used as the material of the heating resistor 23.

Figure 16:
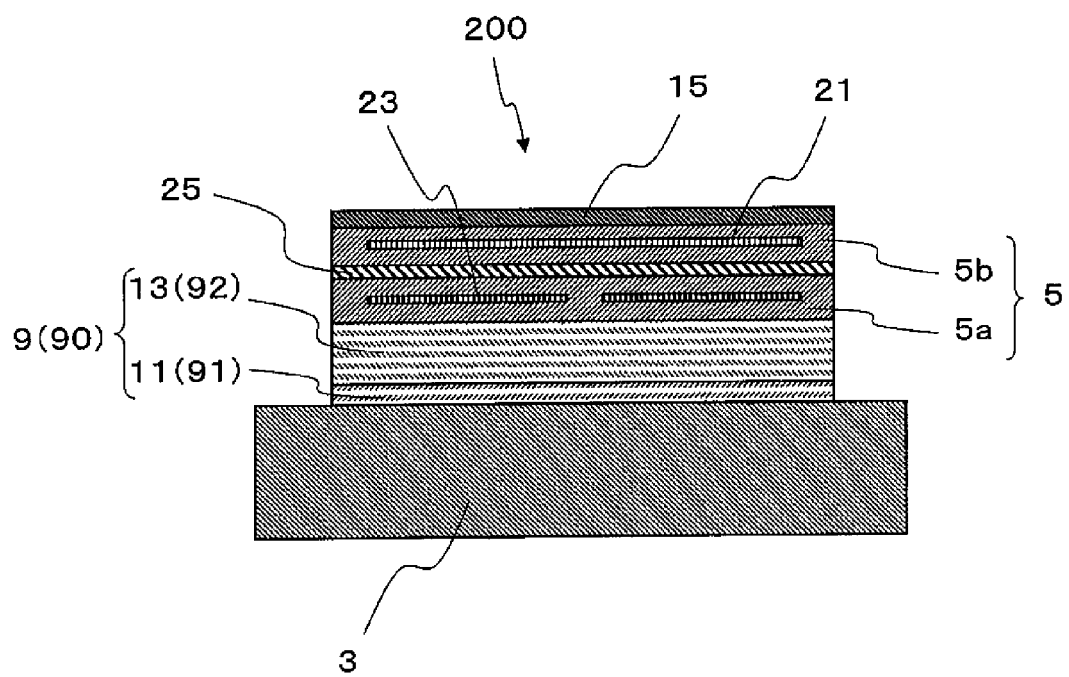
FIG. 16 is a sectional view showing the variation of an electrostatic chuck according to the first embodiment of the present invention.

While the heating resistor 23 and the electrode 21 may be disposed in one insulating material 5 as shown in FIG. 15, the insulating layer 5 where the heating resistor 23 is embedded and the insulating material 5 where the electrode 21 is embedded may be formed separately and bonded together via the bonding member 25 as shown in FIG. 16.

The invention claimed is:

1. A wafer support member, comprising;
a base:
an insulating material; and
a bonding layer bonding the base and the insulating material, wherein the bonding layer having a stacked structure of a plurality of layers which includes a first layer and a second layer located closer to the insulating material than the first layer, and
a third layer disposed between the first layer and the second layer,
wherein the first layer has a thickness larger than that of the second layer, and
wherein the third layer has a thickness smaller than that of the first layer and larger than that of the second layer.

2. The wafer support member according to claim 1, wherein the plurality of layers contain a substantially same resin as the main component.

3. An electrostatic chuck, comprising:
the wafer support member according to claim 1; and
an electrode which is disposed in the insulating material and attracts a wafer by electrostatic force.

4. The electrostatic chuck according to claim 3, further comprising a heating resistor disposed in the insulating material.

5. A wafer support member, conmising:
a base;
an insulating material; and
a bonding layer bonding the base and the insulating material, the bonding layer having a stacked structure of a plurality of layers which includes a first layer and a second layer located closer to the insulating material than the first layer; and
a third layer disposed between the first layer and the second layer,
wherein the first layer has a thickness smaller than that of the second layer, and
wherein the third layer has a thickness larger than that of the first layer and smaller than that of the second layer.

6. The wafer support member according to claim 5, wherein the plurality of layers contain a substantially same resin as the main component.

7. An electrostatic chuck, comprising:
the wafer support member according to claim 5; and
an electrode which is disposed in the insulating material and attracts a wafer by electrostatic force.

8. The electrostatic chuck according to claim 7, further comprising a heating resistor disposed in the insulating material.

9. A wafer support member, comprising:
a base;
an insulating material; and
a bonding layer bonding the base and the insulating material, wherein
the bonding layer having a stacked structure of a plurality of layers which includes a first layer and a second layer located closer to the insulating material than the first layer, and
a third lager disposed between the first layer and the second layer,
wherein a thermal conductivity of the first layer and a thermal conductivity of the second layer are different from each other, and
wherein the third layer has a thermal conductivity higher than that of the first layer, and the second layer has thermal conductivity higher than that of the third layer.

10. The wafer support member according to claim 9, wherein at least one of the first layer and the second layer contains a filler, and
wherein a content of the filler in the second layer is higher than that in the first layer.

11. The wafer support member according to claim 9, wherein at least one of the first layer and the second layer contains a filler, and
wherein a surface area of the filler contained in the second layer is higher than that in the first layer.

12. The wafer support member according to claim 9,
wherein the first layer contains a first filler and the second layer contains a second filler, and
wherein the second filler has thermal conductivity higher than that of the first filler.

13. The wafer support, member according to claim 10,
further comprising a fourth layer which is located closer to the insulating material than the second layer and bonds with the insulating material,
wherein the fourth layer has a content of the filler less than that of the other layers which constitute the bonding layer.

14. The wafer support member according to claim 13, wherein the fourth layer does not contain the filler.

15. The wafer support member according to claim 13, wherein the fourth layer has a thickness smaller than that of the second layer.

16. The wafer support member according to claim 9, wherein the plurality of layers contain a substantially same resin component.

17. An electrostatic chuck, comprising:
the wafer support member according to claim 9; and
an electrode which is disposed in the insulating material and attracts a wafer by electrostatic force.

18. The electrostatic chuck according to claim 17, further comprising a heating resistor disposed in the insulating material.

* * * * *